(12) United States Patent
Schenck et al.

(10) Patent No.: US 6,380,786 B1
(45) Date of Patent: Apr. 30, 2002

(54) DIGITAL PHASE LOCK LOOP

(75) Inventors: Stephen R. Schenck, McKinney; Bernhard H. Andresen, Dallas, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/271,740

(22) Filed: Mar. 18, 1999

Related U.S. Application Data

(62) Division of application No. 08/970,917, filed on Nov. 14, 1997, now Pat. No. 5,982,213.

(51) Int. Cl.$^7$ .................................................. H03K 5/13
(52) U.S. Cl. ................................... 327/276; 327/278
(58) Field of Search .................................. 327/407, 408, 327/149, 152, 153, 158, 161, 269, 270, 271, 272, 276, 277, 278, 281

(56) References Cited

U.S. PATENT DOCUMENTS

| | | | | |
|---|---|---|---|---|
| 4,901,077 A | * | 2/1990 | Christopher | 341/143 |
| 5,012,126 A | * | 4/1991 | Feldbaumer et al. | 327/410 |
| 5,327,031 A | | 7/1994 | Marbot | 307/603 |
| 5,548,235 A | | 8/1996 | Marbot | 327/158 |
| 5,764,092 A | | 6/1998 | Wada et al. | 327/271 |
| 5,805,003 A | | 9/1998 | Hsu | 327/270 |
| 5,923,676 A | * | 7/1999 | Sunter et al. | 371/22.5 |
| 5,953,284 A | * | 9/1999 | Baker et al. | 365/233 |

OTHER PUBLICATIONS

"A Portable Clock Multiplier Generator Using Digital CMOS Standard Cells", Combes, et al., IEEE Journal of Solid–State Circuits, vol. 31, No. 7, 07/96.

"Thèse de Doctorate de l'Université Pierre et Marie Curie (Paris 6)", Combes, MCG95: Générateur de Multiplier d'horlge, Dec. 12, 1994.

* cited by examiner

*Primary Examiner*—Tuan T. Lam
(74) *Attorney, Agent, or Firm*—Ronald O. Neerings; Wade James Brady, III; Frederick J. Telecky, Jr.

(57) ABSTRACT

A clock multiplier (40) comprises a digital phase lock loop circuit having a single variable delay stage (44) for generating high and low phases for the output clocks. The variable delay stage (44) includes a commutator 64 which chooses between the signal propagating on first and second delay paths (52 and 54). The delay on the delay paths can be incrementally adjusted using capacitors (58 and 61) selectively enabled between the path and ground. If the variable delay is insufficient to lock the output to the reference clock, a prescaler (72) automatically divides the output as needed. A stutter mode prevents short pulses, caused by a transition of the reference clock arriving shortly after the transition of the output clock to a low state, from being passed to the clock multiplying circuitry. The clock multiplier (40) may use a free running mode after lock is obtained, where adjustments are made relative to the degree of difference between the output clock and the reference clock.

11 Claims, 10 Drawing Sheets

DIGITAL PHASE LOCK LOOP

CROSS-REFERENCE TO RELATED APPLICATIONS

This application is a divisional of U.S. appl. Ser. No. 08/970,417, filed Nov. 14, 1997 now U.S. Pat. No. 5,982,213 and is related to U.S. appl. Ser. No. 08/970,737 to Andresen et al, filed concurrently herewith, now U.S. Pat. No. 6,115,439.

STATEMENT OF FEDERALLY SPONSORED RESEARCH OR DEVELOPMENT

Not Applicable

BACKGROUND OF THE INVENTION

1. Technical Field

This invention relates in general to electronic circuits and, more particularly, to digital phase lock loop circuits.

2. Description of the Related Art

In order to produce high frequency clocks, as required by many of today's VLSI (Very Large Scale Integration) circuits, integrated clock multipliers are used. Frequency multiplication can be produced by a number of different circuits. The most common of these circuits is the analog phase lock loop circuit (PLL).

The PLL suffers from many shortcomings. First, it cannot be digitally simulated, so verification of lock-up and jitter specifications is difficult. Secondly, PLLs require external components, which are not desirable in many applications.

Digital PLLs (DPLLs), on the other hand can be readily simulated and do not require external components. They offer other advantages, such as faster time-to-lock and they can maintain a lock output frequency even after loss of the reference signal. Once the reference signal is regained, a DPLL can remain in lock, unless there has been significant drift during loss of the signal.

Heretofore, however, many DPLL designs have had their own shortcomings. First, they may have excessive power requirements for many applications. Second, they may be unable to meet jitter requirements in some cases.

Therefore, a need has arisen for a low power DPLL able to meet strict jitter requirements.

BRIEF SUMMARY OF THE INVENTION

The present invention provides a clock multiplier circuit. In a first aspect of the invention, circuitry for generating a series of clock cycles is provided, where each cycle has a logical high phase and a logical low phase, responsive to a transition of a reference clock signal. The generating circuitry comprises control circuitry coupled to a variable delay circuit for generating timing for both the logical high phases and logical low phases series of clock cycles.

This aspect of the invention provides for a single variable delay circuit for generating both high and low logical levels, thereby reducing circuitry and, hence, power requirements.

In a second aspect of the invention, a variable delay circuit is provided. A first delay circuit receives a control signal and outputs the control signal after a first controllable delay period. A second delay circuit receives the control signal and outputs the control signal after a second controllable delay period. A commutator coupled to the first and second delay circuits passes the output of the delay circuit with the shorter delay period.

This aspect of the invention provides a variable delay which can produce consistent incremental delays and does not use opposing amplifiers which can cause current spikes.

In a third aspect of the invention, a clock multiplier comprises circuitry for generating a series of clock cycles responsive to a reference clock, the length of the series of clock cycles dependent upon a controllable delay. Compare circuitry determines whether the length of the series of clock cycles exceeds the length of the reference clock. Circuitry for increasing the controllable delay operates responsive to said compare circuitry. Dividing circuitry divides the series of clock cycles to generate a divided clock signal after the controllable delay exceeds a predetermined delay.

This aspect of the invention automatically divides the series of clock cycles so that the clock multiplier can work over a broad frequency range.

BRIEF DESCRIPTION OF THE SEVERAL VIEWS OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The present invention is best understood in relation to FIGS. 1–17 of the drawings, like numerals being used for like elements of the various drawings.

Figure 1:
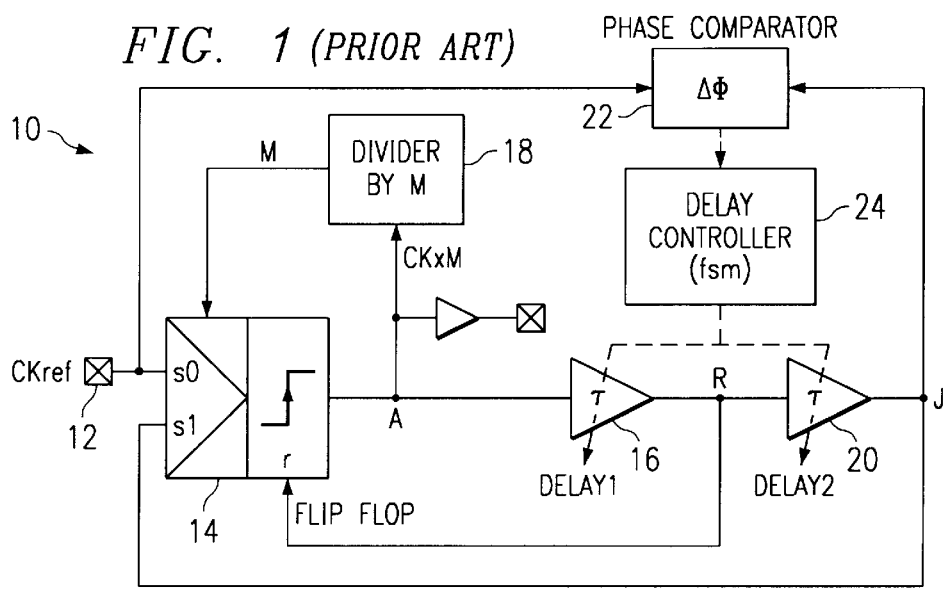
FIG. 1 illustrates a block diagram of a prior art digital phase lock loop circuit (DPLL)
Figure 2:
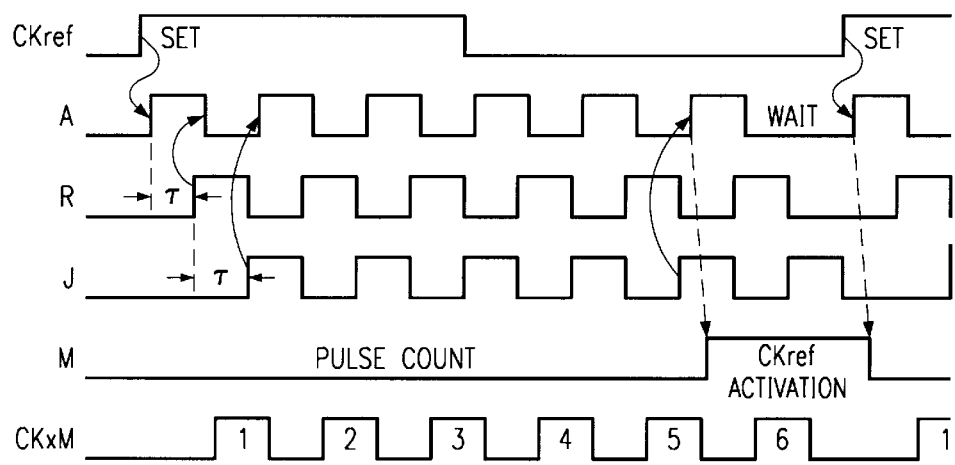
FIG. 2 illustrates a timing diagram for the DPLL of FIG. 1.

FIGS. 1 and 2 illustrate a prior art clock multiplier circuit. FIG. 1 shows a block diagram of the clock multiplier circuit 10. An input clock (CKref) 12 is coupled to a first multiplexed input to the set input of a set-reset (SR) flip-flop 14. The output of the flip-flop 14 is coupled to a first variable delay circuit 16 and to a divider circuit 18. The output of the first variable delay circuit 16 is coupled to the input of a second variable delay circuit 20 and to the reset input of flip-flop 14. The output of the second variable delay circuit 20 is coupled to the second multiplexed input of the flip-flop 14 and to the input of phase comparator 22. Phase comparator 22 is also connected to the CKref. The output of the phase comparator 22 is connected to delay control logic 24. Delay control logic 24 controls the delays associated with the first and second variable delay circuits 16 and 20. The divider 18 controls which input, CKref or J, is coupled to the set input of SR flip flop 14.

In operation, the flip-flop 14 and variable delay circuits 16 and 20 form a multivibrator, as shown in the timing diagram of FIG. 2. A rising edge of CKref initiates a multivibrator burst, causing a low-to-high transition at node A, the output of flip-flop 14. This is detected by divider 18, which causes the set input of flip-flop 14 to switch to node J, the output of delay circuit 20. One delay period ($\tau$) later, the low-to-high transition at node A propagates through variable delay circuit 16 and appears at node R, which is coupled to the reset input of flip-flop 14. The low-to-high transition at R thus causes a high-to-low transition at the output of flip-flop 14. After a second delay period $\tau$, the low-to-high transition at node R propagates through variable delay circuit 20 to node J, which is coupled to the set input of the flip-flop 14. Thus, the low-to-high transition at node J causes a low-to-high transition at node A.

The clock signal continues at node J without external stimulus for m cycles, which are counted by divider 18. At the $m^{th}$ cycle, the divider switches the set input to flip-flop 14 from node J to CKref. Also, the phase comparator 22 measures the displacement between the rising edge of CKref and J. The phase comparator 22 sends a signal to delay controller 24 responsive to the displacement and the delay controller adjusts the value of the delay (i.e., $\tau$) through delay circuits 16 and 20.

Assuming that the delay through the delay circuits 16 and 20 can be incremented by a value of $\theta$, typically having a value of approximately 50 psec for a 1 micrometer technology (using the variable delay circuit described in connection with U.S. Pat. No. 5,327,031 to Marbot et al, issued Jul. 5, 1994), and assuming that the delays are constant during one complete cycle of CKref, the accumulated error can approach 2m$\theta$. For clock multiplication by a factor of 20, the error could be as high as 2 ns. To solve this problem, the designer of the multiplication circuit of FIG. 1 suggests controlling the delay circuits 16 and 20, such that a delay of $\tau$ is applied n times and a delay of $\tau+\theta$ is applied m–n times, reducing the error to a maximum of 2$\theta$. The designer also suggests that a frequency divider could be added to the output of the multiplication circuit 10 to reduce the output frequency.

Figure 3:
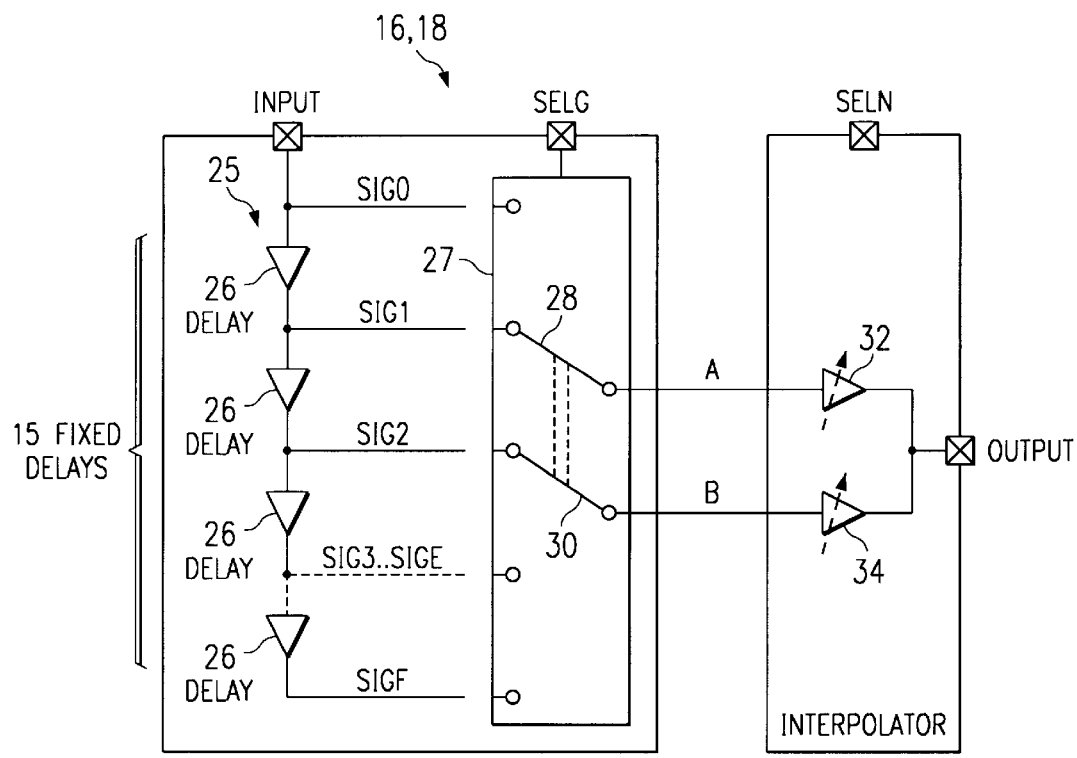
FIG. 3 illustrates a block diagram of a variable delay circuit used in the DPLL of FIG. 1.

FIG. 3 illustrates a simplified block diagram of a prior art delay circuit 16 (or 20) used in the clock multiplication circuit of FIG. 1. This circuit is described in greater detail in U.S. Pat. No. 5,327,031, referenced above. In operation, the delay circuit has a delay chain 25 including sixteen delay stages 26 connected in series. A select circuit 27 couples first and second inputs 28 and 30 across a selected one of the delay stages. These inputs are coupled to an interpolator circuit, wherein respective variable amplifiers 32 and 34 interpolate between the earlier and later signals output from the delay chain 25.

A problem with this circuit is that the interpolation technique is not precisely linear, thereby causing the incremental delays generated by the circuit to be unequal. Secondly, combining the outputs of two amplifiers in opposition can cause current spikes and, hence, errors.

Figure 4:
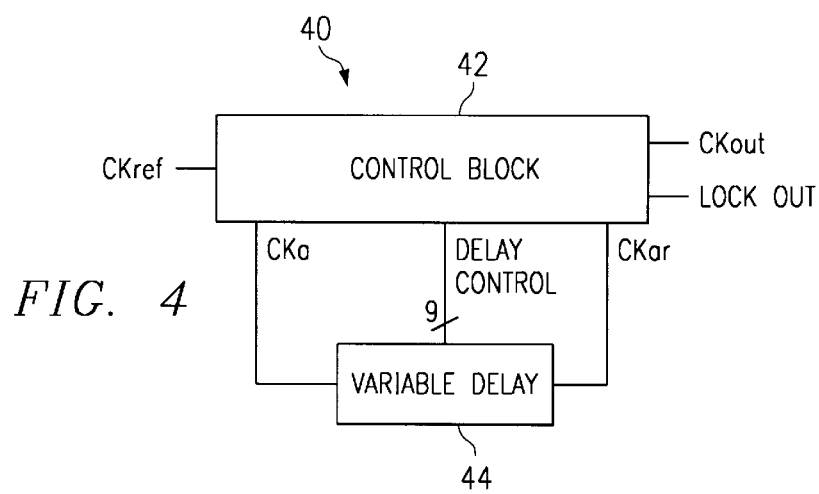
FIG. 4 illustrates a block diagram of a DPLL.

FIG. 4 illustrates a simplified block diagram of a clock multiplier (DPLL) 40 which provides significant improvements over the prior art. Control block 42 receives the input clock CKref. Responsive to CKref, control block 42 outputs a clock signal CKa to variable delay circuit 44, along with delay control signals, described in greater detail hereinbelow. Variable delay circuit 44 outputs clock signal CKar to control block 42. Control block 42 outputs a clock, CKout and a Lock signal indicating whether the CKout is locked on the input signal CKref.

Importantly, as shown in FIG. 4, the clock multiplier 40 uses a single variable delay stage 44, rather than two sequential delay stages 16 and 20 as shown in FIG. 1, which reduce the power consumed by the clock multiplier.

Figure 5:
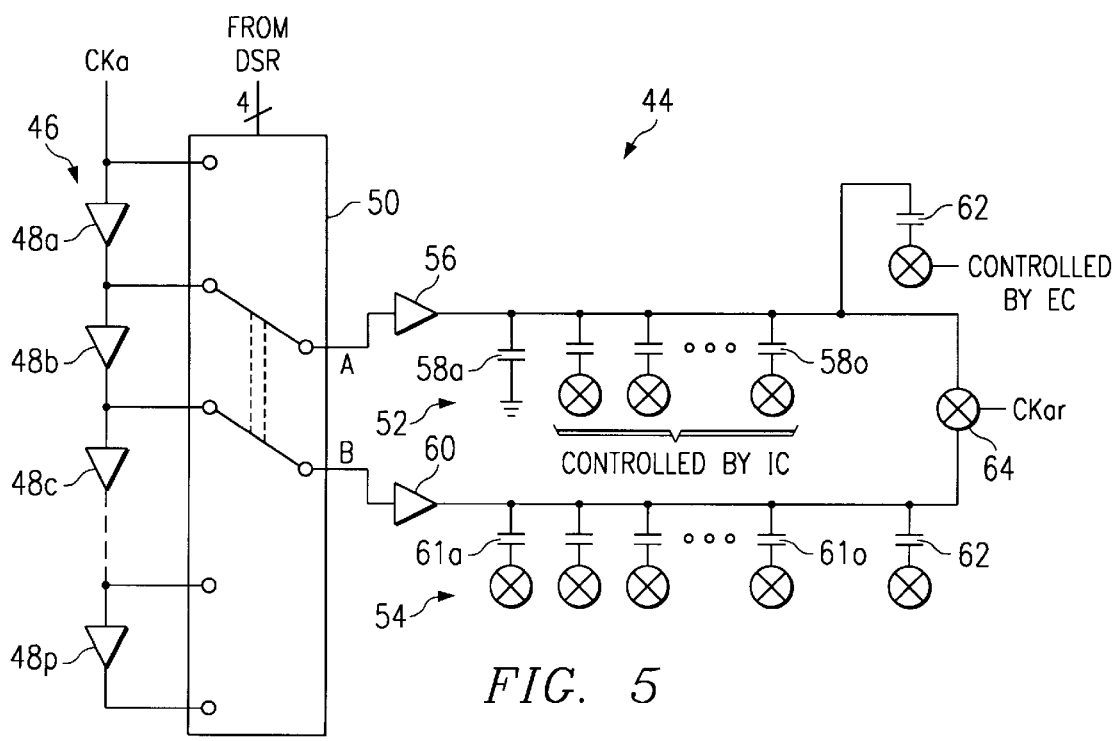
FIG. 5 illustrates a block diagram of a variable delay circuit used in the DPLL of FIG. 4.

FIG. 5 illustrates a block diagram of the variable delay circuit 44, which uses an electronic commutator (described in connection with FIG. 7) in its preferred embodiment. Clock CKa (described in greater detail hereinbelow) is received into a delay string 46 comprising fifteen delay elements 48 connected in series, where individual delay elements are referenced as delay elements 48a–48p. As would be clear to one skilled in the art, more or less delay elements could be used in the delay string 46. Switch 50 couples leads A and B across one of the delay elements 48. Switch 50 is controlled by the DSR section of control block 42, described in greater detail hereinbelow.

Lead A couples the input side of the selected delay element 48 to a variable delay path 52 and lead B couples the output side of the selected delay element 48 to path 54. Variable delay path 52 comprises a buffer 56 and a plurality of capacitors 58 (fifteen capacitors 58 are shown in used in the embodiment of FIG. 5), individually referenced as capacitors 58a–58o. Capacitors 58 are selectively coupled in parallel between the output of buffer 56 and ground under control of the DSR section of control block 42, described in greater detail hereinbelow. Path 54 comprises a buffer 60 and a plurality of capacitors 61 (individually referenced as capacitors 61a–61o) matching buffer 56 and capacitors 58. In this path the DSR control block uncouples all capacitive loads. An additional capacitor 62 is selectively coupled between the output of buffer 56 and ground and between the output of buffer 60 and ground under control of the EC section of control block 42, also described in greater detail below. Paths 52 and 54 are coupled at commutator 64. The output of commutator 64 is clock CKar. Commutator 64 passes the edge of clock CKa which arrives first, either the edge which arrives via through path 52 or the path that arrives through path 54.

In operation, delay elements 48 provide coarse adjustment of the delay through variable delay circuit 44. When switch 50 couples leads A and B across delay element 48a, the smallest delay through the delay chain 46 is achieved, as CKa propagates through a single delay element 48. On the other hand, when switch 50 couples leads A and B across delay element 48p, the largest delay is achieved, since CKa must propagate through all the delay elements 48 in the delay string 46.

The capacitors 58 (and capacitors 61) provide a finer resolution of delay through delay element 44. After propagating through the delay element(s) 48, the CKa signal propagates through the delay path 52. The capacitors may be individually coupled to ground under control of control block 42. Each capacitor 58 enabled by control block 42 slightly increases the delay of the propagation through the delay path 52. Each enabled capacitor 58 (or capacitor 61) approximately accounts for an additional 50 psec maximum delay through the path.

Figure 6A:
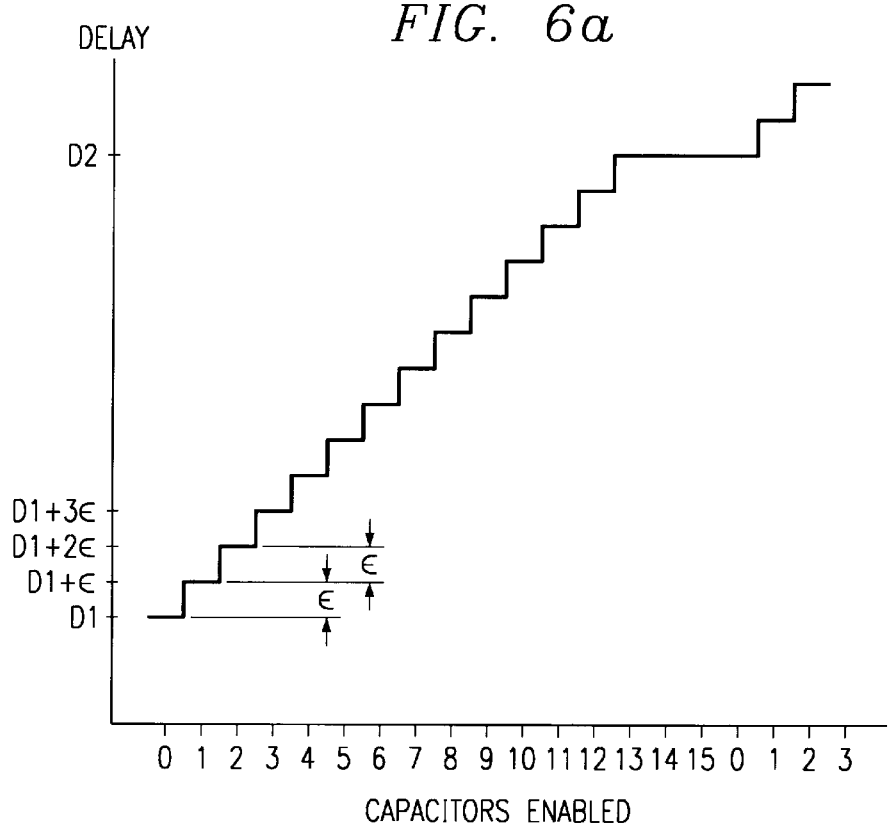
FIGS. 6a, 6b, 6c and 6d illustrate graphs of delay for the variable delay circuit of FIG. 5 using an overlapping and non-overlapping delay structures.
Figure 6B:
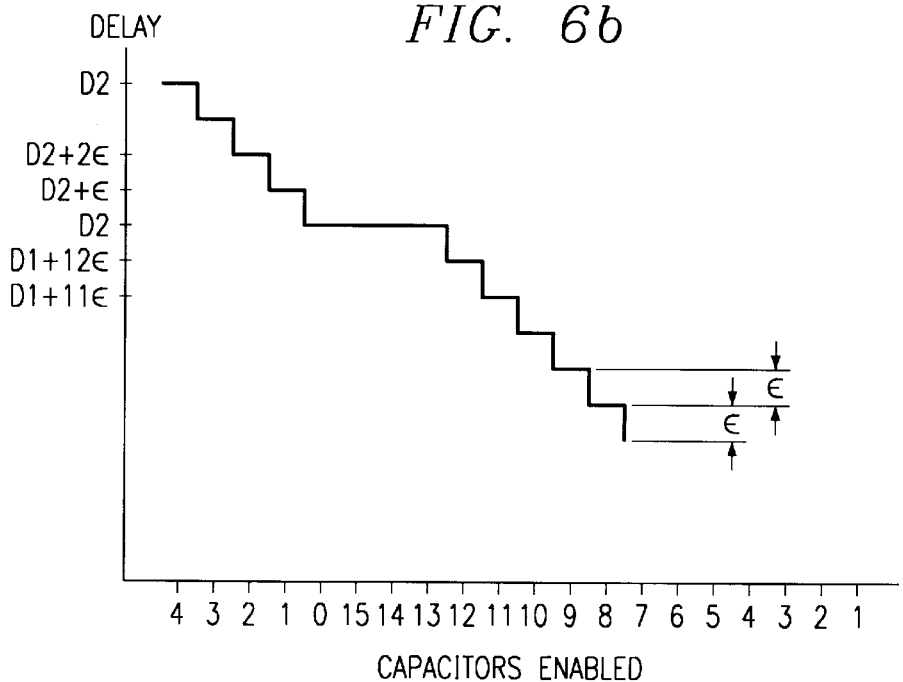

The commutator 64 passes the first CKa clock edge, either from path 52 or path 54, in order to prevent discontinuities in the incremental delay provided by the variable delay circuit 44. FIGS. 6*a*–*b* illustrate the delay provided by the variable delay circuit 44 using the commutator and FIGS. 6*c*–*d* illustrate the discontinuities which could otherwise result if delay path 52 was designed to exactly match the delay through the delay elements 48.

FIG. 6*a* illustrates the incremental delay which is provided as the capacitors 58 are individually enabled on the delay path 52. It should be noted that the delay through the delay path 52 with all capacitors 58 enabled is greater than the delay though a delay element 48. Starting at the initial delay D1 through the delay chain (i.e., the delay through the delay chain 46 to lead A), the enabling of each capacitor 58 on the delay path 52 produces an additional delay E through the delay path. This incremental delay is substantially equal for each added capacitor. When the delay through the enabled capacitors 58 exceeds the delay through the delay element between lead A and lead B at D2, the circuit may continue to enable additional capacitors 58 to the delay path 52; however, the delay associated with the path will not increase, since the commutator 64 will pass the CKa edge from path 54 prior to passing the CKa edge from path 52 at this point. After all capacitors have been enabled, the next incremental step in delay is achieved by disabling all capacitors in the variable delay path 52 and switching lead A to the next delay element 48 in the delay chain 46. At this point, lead B is connected to one less delay element 48 than lead A. The DSR control disables the plurality of capacitors in path 52 (coupled to lead A), and begins to sequentially enable those in path 54, in the manner described above. Since path 54 alone controls the delay through this transition, there are no delay discontinuities.

Similarly, FIG. 6*b* illustrates the case where delay the variable delay circuit 44 is being incrementally decreased. As can be seen in both cases, the incremental steps in the delay produced by the circuit are uniform, although the same delay level may exist for multiple steps through the delay path 52.

Figure 6C:
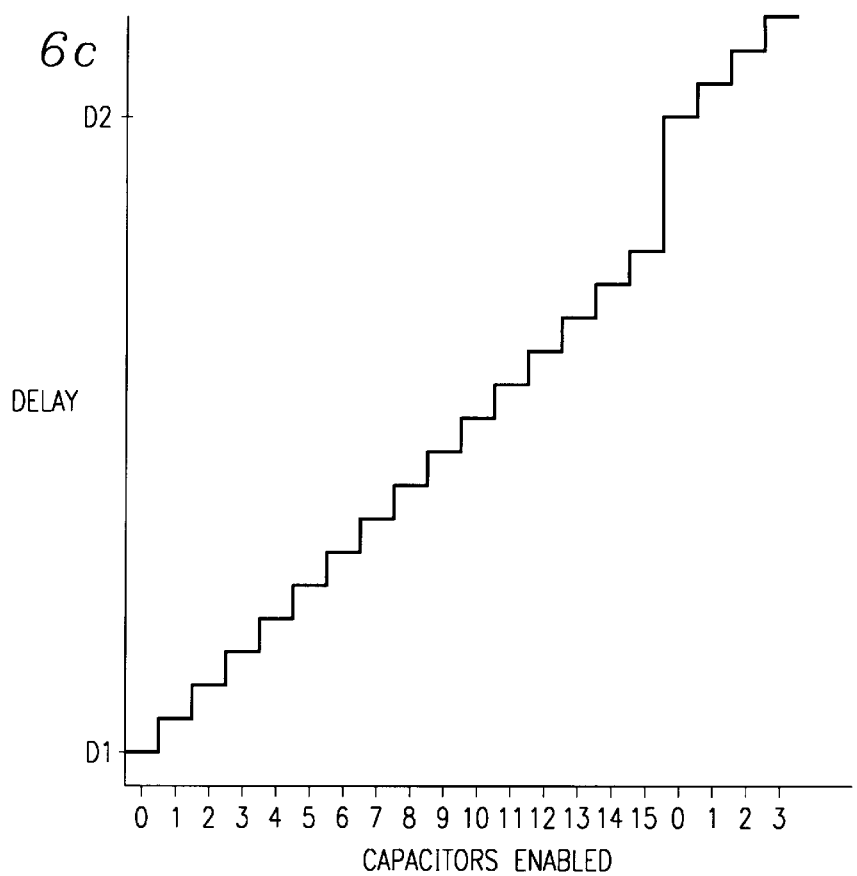
Figure 6D:
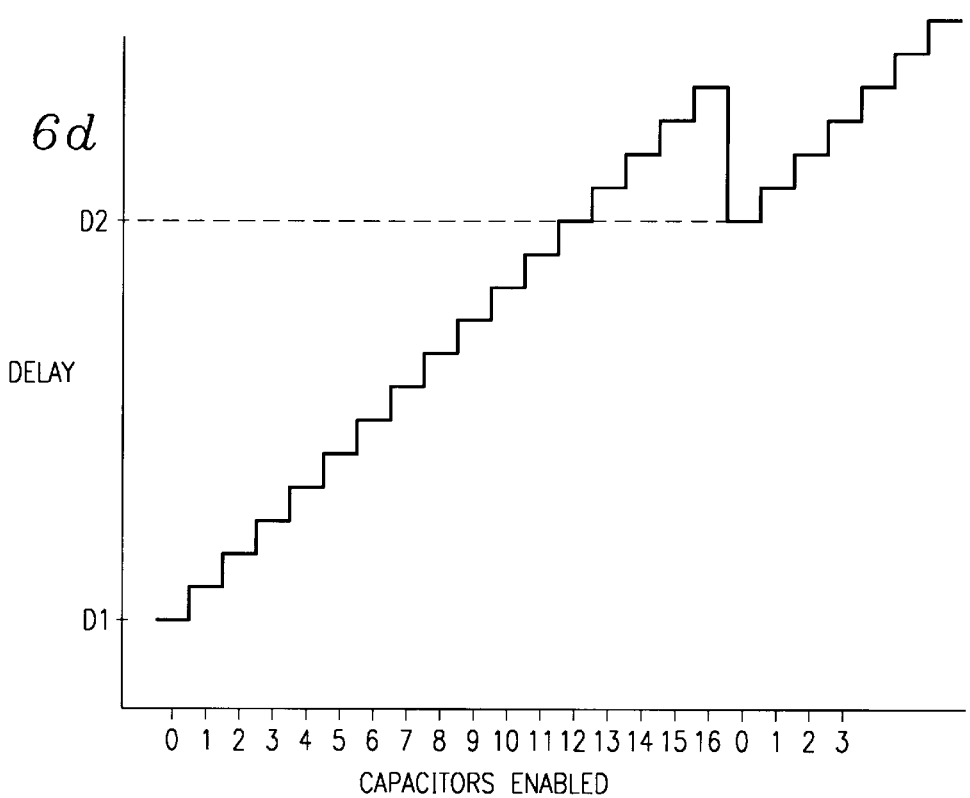

FIGS. 6*c*–*d* illustrate the problems that can occur in the case where a commutator is not used, but rather the delay is dependent upon the delay through the delay chain 46 (up to lead A) and the capacitors enabled in delay path 52. In this case, if delay through the capacitors 58 did not exactly match the delay through a delay element 48, a discontinuity would occur. In FIG. 6*c*, the delay through the delay path 52 is less than the delay through the delay element 48. In this case, there is a discontinuity causing a large incremental delay as the variable delay circuit 44 increments the delay in the delay chain 46 and eliminates the delay in the delay path 52. In FIG. 6*d*, the delay through the delay path 52 is greater than the delay through the delay element 48. In this case, there is a discontinuity causing a reduction in the variable delay circuit 44 increments the delay in the delay chain 46 and eliminates the delay in the delay path 52. Similar discontinuities can occur as the variable delay circuit is decreasing its delay rather than increasing the delay.

Figure 7:
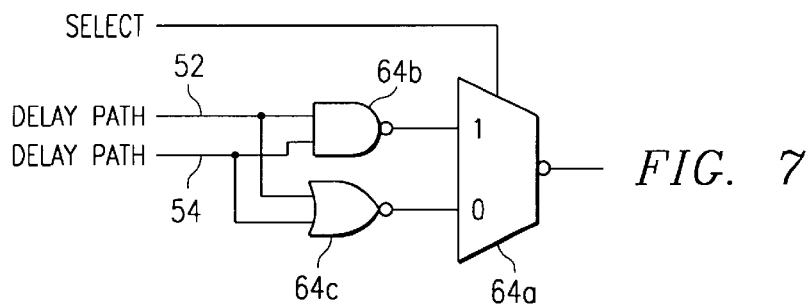
FIG. 7 illustrates a commutator circuit used in the variable delay circuit of FIG. 5.

An embodiment of the commutator 64 is shown in FIG. 7. The commutator 64 comprises a multiplexer 64*a*, which receives inputs from a NAND gate 64*b* and a NOR gate 64*c*. Both the NAND gate 64*b* and the NOR gate 64*c* receive the outputs of delay paths 52 and 54. A SELECT signal controls whether the output of the NAND gate 64*b* or NOR gate 64*c* is passed to the output of the multiplexer 64*a*. Multiplexer 64*a* is inverting to compensate for inversions in gates 64*b* and 64*c*.

In operation, the SELECT signal is low when the next transition is from low-to-high and is high when the next transition is from high-to-low. Thus, when the next transition is from low-to-high, SELECT is set to "0" and the output of the NOR gate 64*c* is passed to the output of the multiplexer 64*a*. In this case, both delay paths 52 and 54-are initially low, causing a high output from the NOR gate 64*c* and a low output from the inverted output of the multiplexer. The first signal on either of the paths 52 or 54 to transition to a high logic level will cause the output of NOR gate 64*c* to transition to a low logic level and the inverted output of the multiplexer 64*a* to transition to a high logic level. When the next transition is from high-to-low, SELECT is set to "1" and the output of the NAND gate 64*b* is passed to the inverted output of the multiplexer 64*a*. In this case, both delay paths 52 and 54 are initially high, causing a low output from the NAND gate 64*b* and a high output from the inverted output of the multiplexer 64*a*. The first signal on either of the paths 52 or 54 to transition to a low logic level will cause the output of NAND gate 64*b* to transition to a high logic level and the inverted output of the multiplexer 64*a* to transition to a low logic level. The SELECT signal is switched low when both of gates 64*c* and 64*b* are high and switched high when both of gates 64*b* and 64*c* are low.

While in the present embodiment, commutator 64 is used to pass the first of the signals at its input, the SELECT signal could be inverted to pass the last of the signals in other applications. Further, the logic gates 64*b* and 64*c* could be expanded to provide more than two inputs to the commutator 64.

Capacitors 62 are used to provide "epsilon correction" for precise adjustment of the delay. These capacitors are enabled independently from the capacitors 58 and 61 by the EC circuitry (shown in FIG. 8) and can increase the delay by a time $\epsilon$. Whereas the delay through the delay string 46 and the delay strings 52 and 54 is applied to each clock input to the variable delay circuit 44, capacitors 62 may be selectively enabled for one or both phases of one or more of the m clocks in a multivibrator burst. Epsilon correction is discussed in greater detail in connection with FIGS. 10*a*–*d*.

Figure 8:
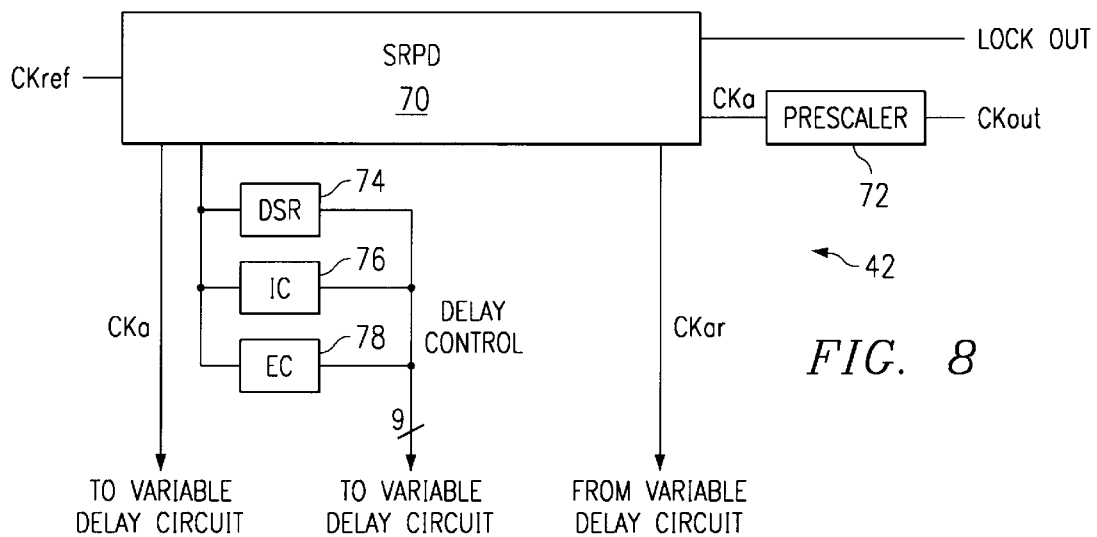
FIG. 8 illustrates a block diagram of a control circuit used in the DPLL of FIG. 4.

FIG. 8 illustrates a block diagram of the control block 42. CKref is input to SRPD 70, which is a phase detector and multivibrator control circuit (described in greater detail in connection with FIG. 10). SRPD 70 outputs the CKa signal to the variable delay circuit 44 and to prescaler 72. SRPD 70 further outputs control signals to DSR (delay string controller) 74, IC (commutator controller) 76 and EC (epsilon controller) 78. DSR 74, IC 76 and EC 78 output signals to the variable delay controller 44 as shown in FIG. 5.

In operation, SRPD receives the reference clock, CKref, and generates signals indicative of whether CKa, is locked with CKref and whether it leads or lags CKref. The Lock and Up/down signals are passed to DSR 74, IC 76 and EC 78 which adjust the delay through the delay string 46 and delay path 52 accordingly.

Figure 9:
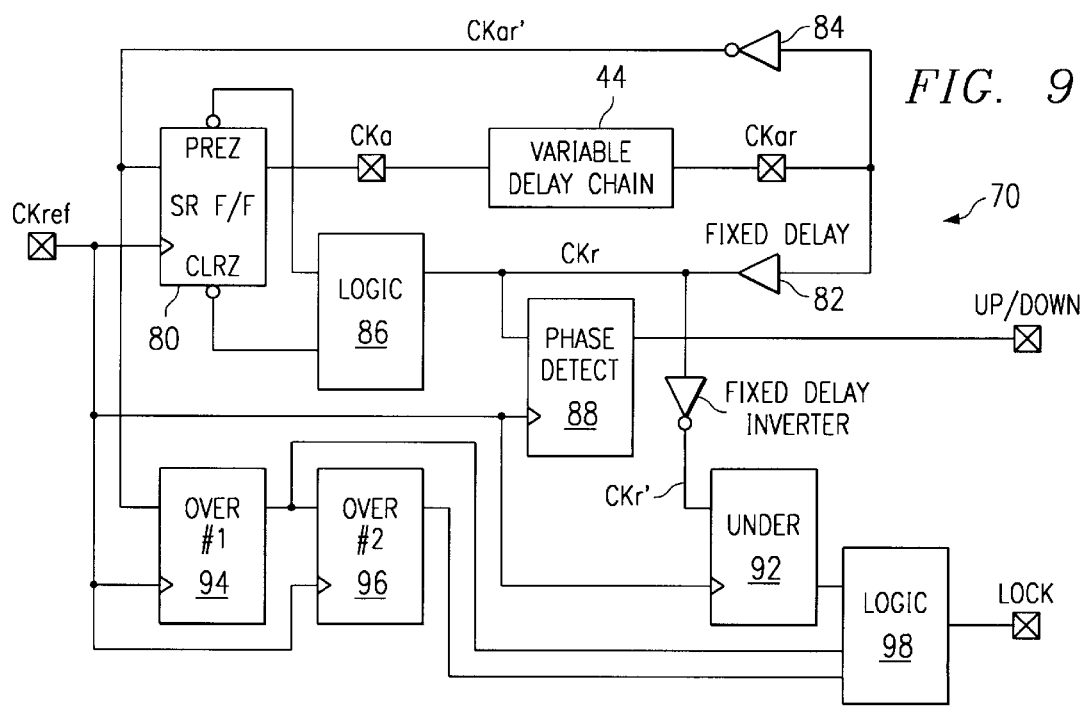
FIG. 9 illustrates a block diagram of a phase detector and multivibrator control circuit in the control circuit of FIG. 8.

FIG. 9 illustrates a more detailed block diagram of the SRPD 70 as connected to the variable delay circuit 44. CKref is coupled to the clock input of an SR flip-flop 80 The output of flip-flop 80 is the CKa clock, shown in FIG. 4, which is connected to the input of the variable delay circuit 44. The output of the variable delay circuit 44 is the CKar clock signal, which is input to a non-inverting fixed delay buffer 82 and to an inverting delay buffer 84. The output of the inverting delay buffer 84 is coupled to the data input of the SR flip-flop 80. The output of the non-inverting delay buffer 82 is coupled to logic 86, which controls the Clear (set output to 0) and Preset (set output to 1) inputs of the SR flip-flop 80. The output of the non-inverting delay buffer 82 is also connected to a phase detect latch 88, which is clocked by CKref. The output of phase detect latch 88 is the Up/Down signal. Further, the output of non-inverting delay buffer 82 is coupled to the input of inverting delay buffer 90, which has its output coupled to the data input of Under latch 92. Under latch 92 is also clocked by CKref.

The output of inverting delay buffer 84 is also coupled to the data input of Over1 latch 94. The output of Over1 latch 94 is input to the data input of Over2 latch 96 and to Lock logic 98. The outputs of the Under latch 92 and the Over2 latch 96 are also coupled to Lock logic 98. Over1 latch 94 and Over2 latch 96 are both clocked by CKref.

In general operation, the SRPD 70 forms a multivibrator in conjunction with the variable delay circuit 44. Upon receipt of a low-to-high transition of CKref, a series of pulses are generated having a frequency dependent upon delay $\tau_V$ though the variable delay circuit 44 and a delay $\tau_F$ through the fixed delay buffer 82. The phase detect latch 88 will latch a value at each low-to-high transition of CKref which indicates whether the delay should be increased or decreased on the next cycle to maintain lock. The Under, Over1 and Over2 latches 92–96 are used by logic 98 to determine whether the output signal is within a specified range from CKref. The inverter 84 prevents abrupt changes in CKref from causing false inputs to the multivibrator.

Figure 10:
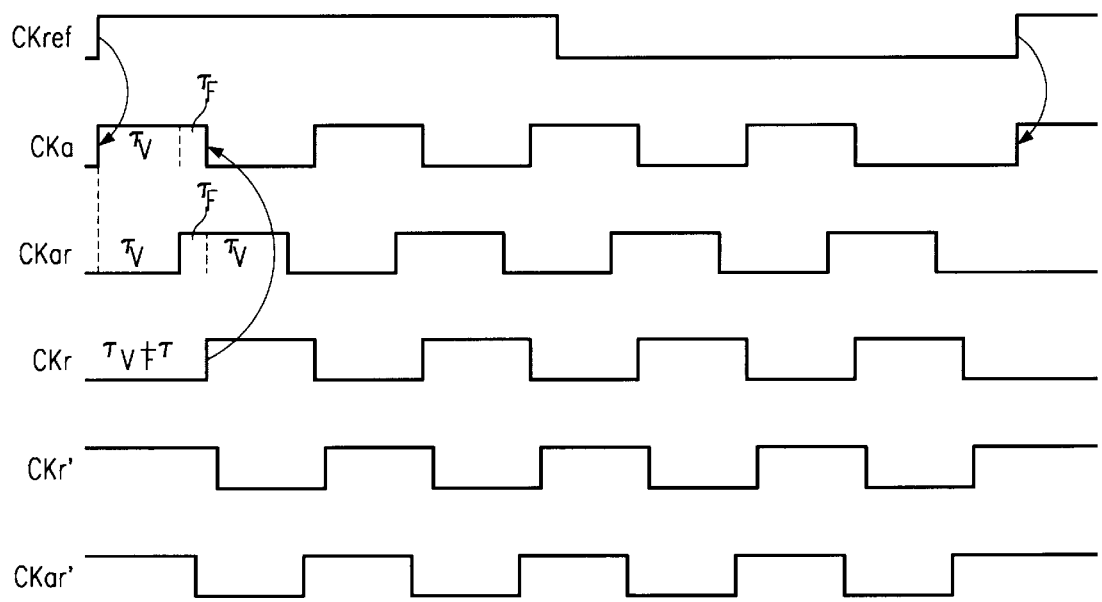
FIG. 10 illustrates a timing diagram describing the operation of the multivibrator circuit of FIG. 9.

The detailed operation of the circuit is best described in conjunction with the timing diagram of FIG. 10. The CKref signal is received at SR flip-flop 80, where the high-to-low transition causes a high-to-low transition in clock CKa, the output of flip-flop 80. CKa passes through the variable delay circuit 44 over a time $\tau_V$. The output of the variable delay circuit is CKar, which is input to both inverter 84 and to the fixed delay 82. CKr, the output of the fixed delay, therefore has a low-to-high transition which is offset from the low-to-high transition of CKref by $\tau_V+\tau_F$. Responsive to a transition on CKr, logic 86 causes either a low-to-high or a high-to-low transition on CKa, using the preset and clear control input of flip-flop 80. For m clocks, the variable delay circuit 44 will generate both low and high phases in CKar and CKr of duration $\tau_V$ and $\tau_F$. The next multivibrator cycle begins as CKref transitions to a high logic level.

Since CKar' (the output of inverter 84) is coupled to the data input of flip-flop 80, narrow pulses will be prevented from entering the delay chain. Normally, the data input to the SR flip-flop 80 is a logical "1" when the clocking edge of CKref occurs. An abrupt change in the CKref period could cause mis-operation if the data input were hardwired to a "1" state, since a narrow pulse could be sent into the delay element causing mis-operation in the multivibrator control circuitry. In the illustrated embodiment, the data input of flip flop 80 is connected to CKar', which causes CKref to clock in the current state of CKa if CKref occurs early, thereby preventing glitches from being generated at CKa. Accordingly, the current multivibrator burst will complete, but the next cycle will be missed because the CKref transition was skipped, causing the CKout output to remain low on alternate cycles (stutter mode). Stuttering only occurs when there is too much delay in the delay string, and the control logic will remove delay until an appropriate higher frequency is reached. When the new frequency is obtained, the stuttering will cease and normal operation will resume. The lock signal will indicate that the DPLL is out of lock until the new frequency is reached.

The phase detect register 88 latches the state of CKr responsive to CKref. The output of the phase detect register 88 is the Up/Down signal. This signal indicates whether the delay should be increased (Up/Down=1) or decreased (Up/Down=0).

CKref also clocks the Over1, Over2 and Under registers 94, 96 and 98. CKr is locked with CKref when the output of the Under register 98 is a logical "0" and the output of the Over registers 94 and 96 are both logical "1s". The Over registers 94 and 98 detect when CKref occurs before CKr by more than a predefined time differential. The Over registers 94 and 96 are configured as a shift register so that at least one of the registers 94 or 96 will show an out of lock condition in the event of stuttering due to a narrow pulse being introduced into the system. The Under register 98 detects when CKref occurs after CKr by more than a predetermined time differential.

Figure 11A:
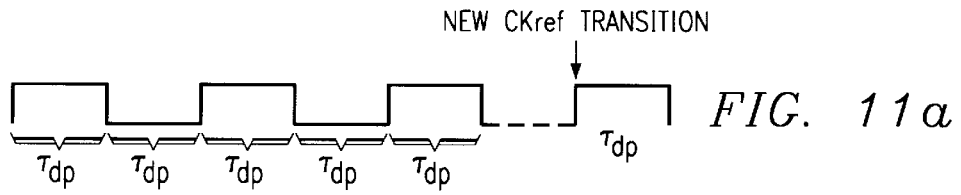
FIGS. 11a, 11b, 11c, 11d and 11e illustrate timing diagrams describing the operation of the epsilon control.
Figure 11B:
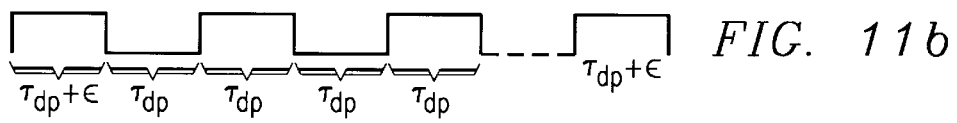
Figure 11C:
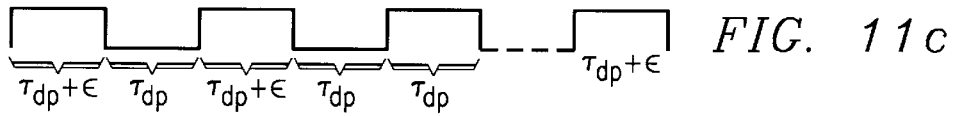
Figure 11D:
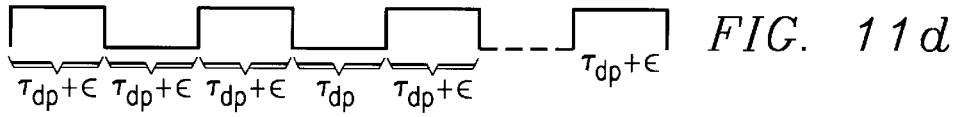

Epsilon correction is illustrated in connection with FIGS. 11a–d. With no correction (FIG. 11a), each clock cycle will have two phases of duration $\tau_{dp}$, equal to the delay through the delay chain 46 and the delay path 52 (or 54). The epsilon correction can be selectively applied to either the first to second phase of any one or more of a m clocks in a multivibrator burst. As shown in FIG. 11b, the epsilon correction is applied to the first phase of the first clock in each multivibrator burst (i.e., the first clock after a transition in CKref). The remaining clocks, and the second phase of the first clock, continue to have a duration of $\tau_{dp}$. In FIG. 11c, the epsilon correction is applied to first phase of the first two clocks of each multivibrator burst. In FIG. 11d, the epsilon correction is applied to the first phases of each clock of the multivibrator burst and to the second phase of the first clock of the burst. Epsilon control is coordinated with automatic prescaler operation, which is described hereinbelow. If there are more than one multivibrator period per output period, $\epsilon$ is applied to the multivibrator periods in a sequence that prevents more than one $\epsilon$ difference between any of the output clock periods.

Figure 11E:
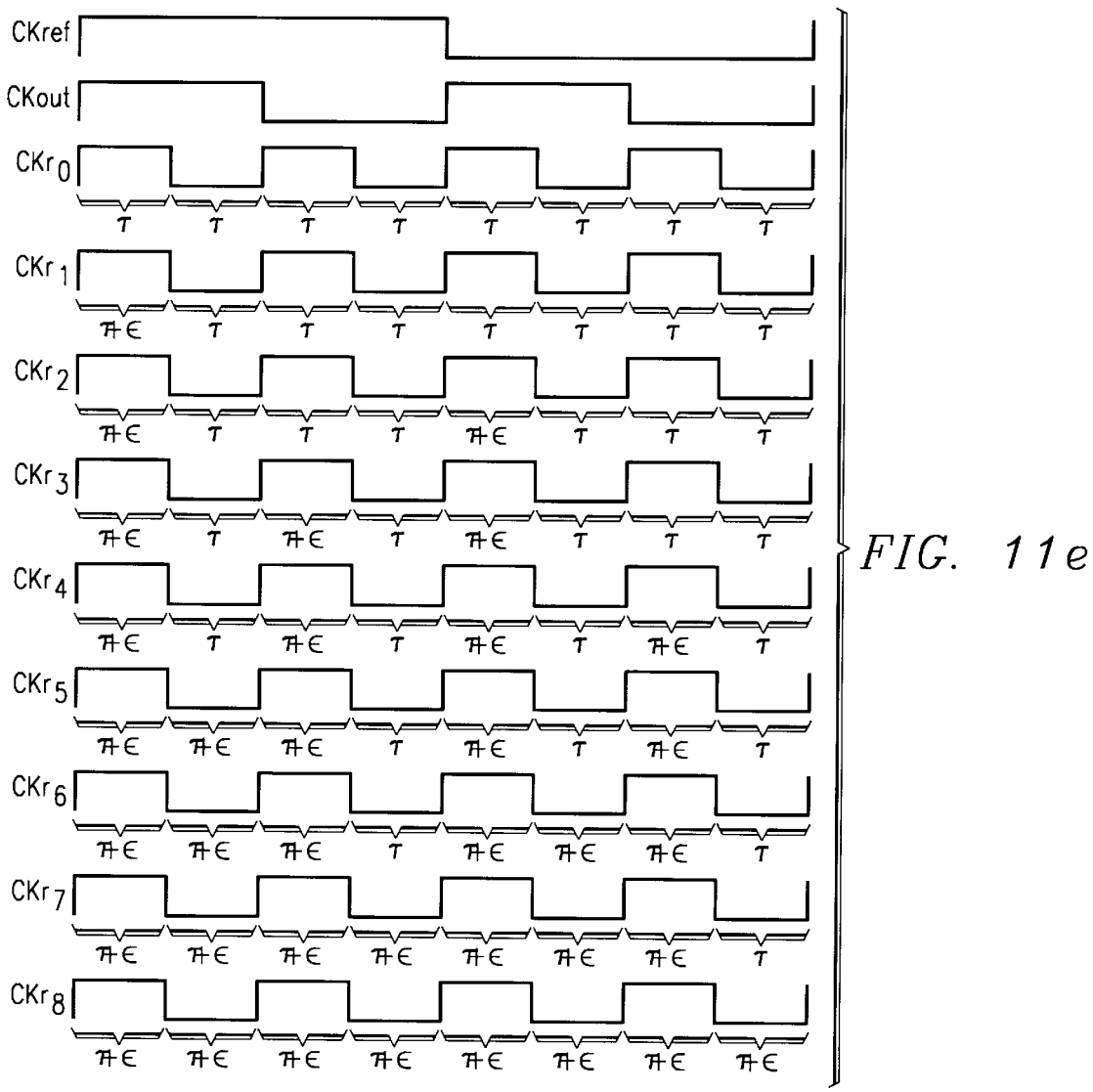
Figure 13:
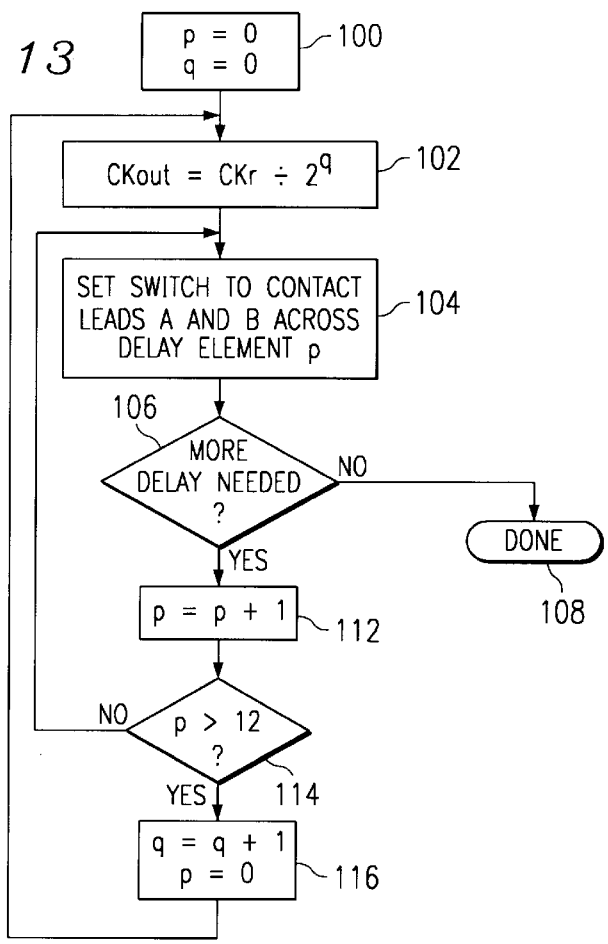
FIG. 13 illustrates a flow chart describing operation of an automatic prescaler circuit.

In FIG. 11e the reference clock signal, CKref, and output clock signal, CKout (with m=2), in a situation where the prescaler is applying a divide ratio of 2 (hence, two CKr periods for every CKout period). CKr0–CKr8 illustrate how $\epsilon$ is applied to CKr when the prescaler is dividing the output. CKr0 demonstrates the CKR clock prior to applying any epsilon correction. To increase delay, the first $\epsilon$ delay is applied to the first phase of the first clock of the first multivibrator period of two clocks, but not to the first phase of the first clock of the second multivibrator burst. Hence, the differential between CKr0 and CKr1 is $\epsilon$. CKr2 shows the case where an additional $\epsilon$ delay is added to CKr1. In this case, $\epsilon$ is applied to the first phases of the first clocks of both the first and second clocks of the multivibrator period. Again, the incremental difference between CKr2 and CKr1 is $\epsilon$. Clock CKr3 through CKr8 illustrate a preferred sequence for adding $\epsilon$ to the CKr clock to increase delay. Hence, the epsilon correction circuitry works in conjunction with the prescaler to achieve the minimum resolution of delay increase for each CKref clock.

The epsilon correction technique allows very precise adjustment of the duration of the multivibrator burst. The overall burst of m clocks can be adjusted by an incremental amount of ε for each burst, with the overall epsilon correction for the burst ranging from zero to 2mε.

In the preferred embodiment, gated clocks generated by the SRPD 70 are used to operate gated counters and synchronization latches in the prescaler 72, DSR 74 EC 78 and IC 76. The use of gated clocks can greatly reduce power consumption throughout the system. Synchronizing latches assure glitch free logic decodes and uniform transition times for all register control signals.

Figure 12:
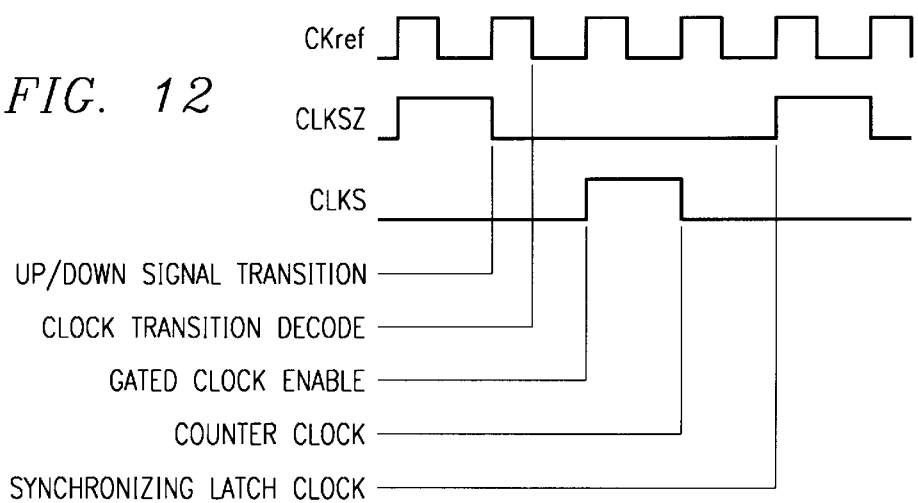
FIG. 12 illustrates a timing diagram for internal clocks driving the DPLL control circuitry.

The internally generated clocks run at ¼ the rate of the incoming CKref signal. FIG. 12 illustrates the relationship of the clock phases as well as the timing for the gated clock counters. Because the internal clock is ¼ the incoming clock frequency, the slew rate of the output delay is one ε per four CKref periods.

The counters controlling the delay stages use gated clocks to minimize power. FIG. 12 illustrates a sequence which may be used to enable the clock to the various counters. The first event is for the phase detector 88 to set the Up/Down logic level. On the following "0" level of CKref, the logic decode determines whether the specific counter is to count or not. If it is to count, then its clock makes a high-to-low transition on the rising edge of CLKS followed by a low-to-high transition on the falling edge of CLKS. The latter transition clocks the counter. The decoding of control signals is done on the counter outputs, which can cause glitches having adverse effects on some of the circuitry; therefore, synchronization transparent latches follow the decoded signals which are enabled on the rising edge of CLKSZ. The rising edge of CLKSZ occurs when the new state of the various counters is first observed.

In order to operate the DPLL over a wide frequency range, the automatic prescaler 72 is used. Adding stages to the delay string would be prohibitive from a component count standpoint to cover a wide output frequency range, and the switch circuit 50 would be very complex with increased propagation delay. Operation of the prescaler is shown in the flow chart of FIG. 13. In step 100, the divide ratio (q) and the switch setting (p) are set to "0". The divide ratio defines the degree to which the prescaler 72 divides the output clock CKr, as CKout=CKr÷$2^q$. Hence for q=0, the prescaler does not divide the output, for q=1, the output is divided by 2, and so on. The switch setting defines the position of leads A and B along the delay chain 46. For p=0, leads A and B are positioned across delay element 48a, for p=1, leads A and B are positioned across delay element 48b, and so on.

In step 102, the divide ratio is set to $2^q$; thus, initially, there is no division of CKr. In steps 104–112, the delay is increased until the Up/Down signal indicates that there is too much delay. In step 104, leads A and B are set across the $p_{th}$ delay element 48. In decision block 106, if the Up/Down signal is a "0", then less delay is needed and the prescaler is set and remains at that value until the DPLL is reinitialized. On the other hand, if the Up/Down signal is a "1", more delay is needed. In this case, p is incremented in block 112.

If p>12 in decision block 114, q is incremented (increasing the divide ratio by a factor of 2) and p is set to "0" (restarting the delay at the beginning of the delay chain 46) in block 116 and the flow returns to block 102. Alternatively, if p<=12 in block 114, then p is incremented to increase the delay in the delay chain 46 and the flow continues in block 104. The decision point is set at the twelfth delay element 48 in the delay chain 46 to allow for some drift in input frequency or operating conditions while q is set. The delay chain 46 is designed in coordination with fixed delays, so an increase in q will give equal delays at p≈4 as for p=12 at q−1.

Figure 14:
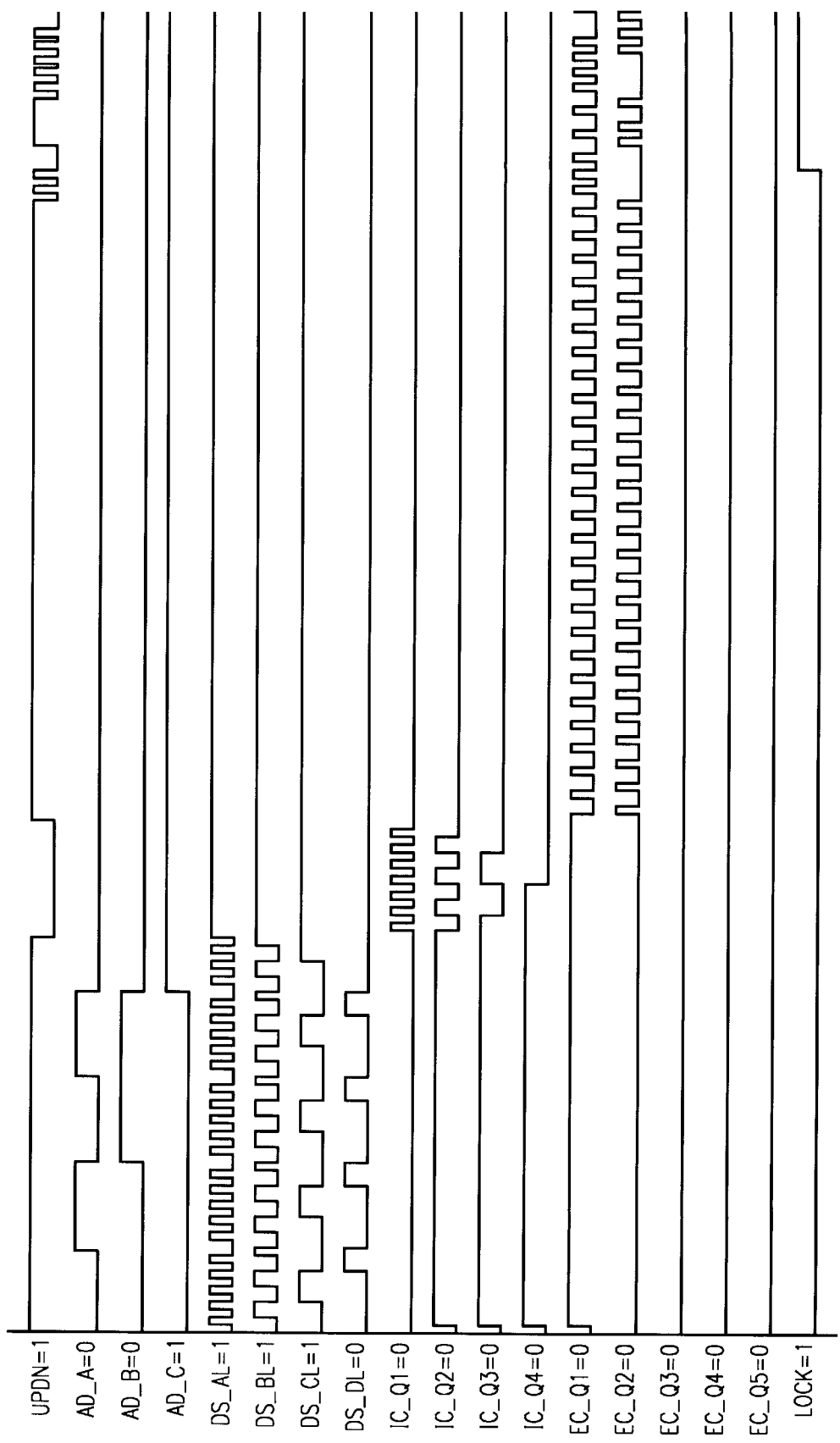
FIG. 14 illustrates a timing diagram illustrating the operation of the DPLL to acquire lock to a reference signal.

FIG. 14 illustrates a timing diagram showing the overall operation of the system to achieve the correct delay. Initially, the Up/Down Signal will be at a high logic level. The prescaler divide ratio q ( shown by bits AD__A, AD__B, and AD__C) is initially set to "0" as is the switch setting p (shown by bits DS__AL, DS__BL, DS__CL, and DS__DL). As stated above, until the Up/Down setting transitions low, the switch setting is increased to a maximum of "12", at which time the divide ratio is increased and the switch setting is returned to the initial position where the delay continues to increase at the new divider ratio. In FIG. 14, Up/Down transitions low when q=4 and p=7. Initially, all capacitors 58 are enabled. Thus, the capacitors 58 are sequentially disabled until Up/Down transitions high. In FIG. 14, the number of enabled capacitors is shown by bits IC__Q1–IC__Q4. At time T2, when all capacitors have been disabled (in this example), Up/Down transitions high. At this point, the epsilon control is invoked, first incrementally adding a delay of ε to the high phases of CKr and then to the low phases of CKr until Up/Down transitions low at T3.

At this point, m times CKout is within a resolution of ε of CKref. Up/Down will continue to transition back and forth and will be corrected by the epsilon circuitry. The number of bits active in the epsilon counter is dependent upon the value of m. In the illustrated example, m=3, so the epsilon correction circuitry counts between three states.

Figure 15:
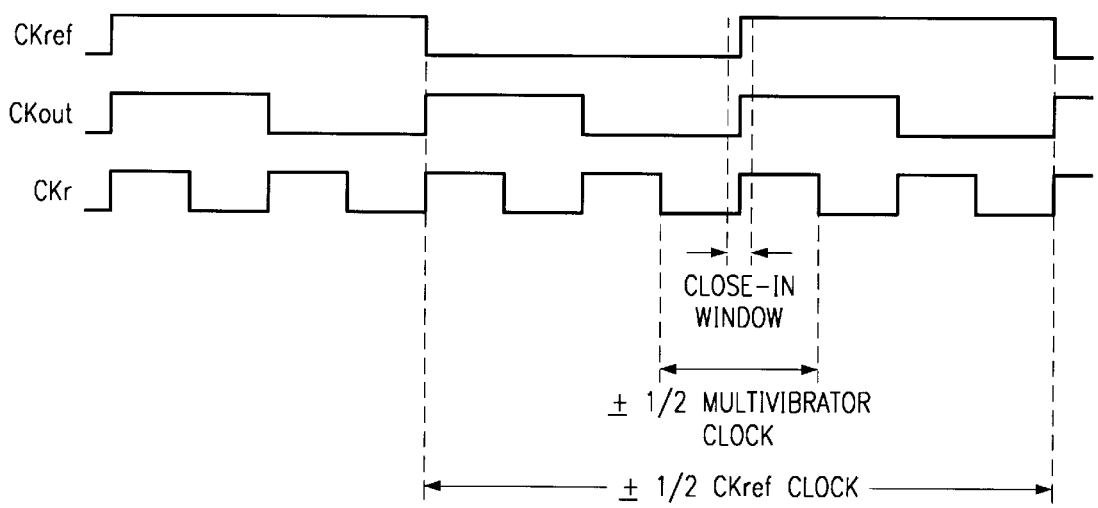
FIG. 15 illustrates a timing diagram illustrating correction windows for a free running mode of the DPLL.
Figure 16:
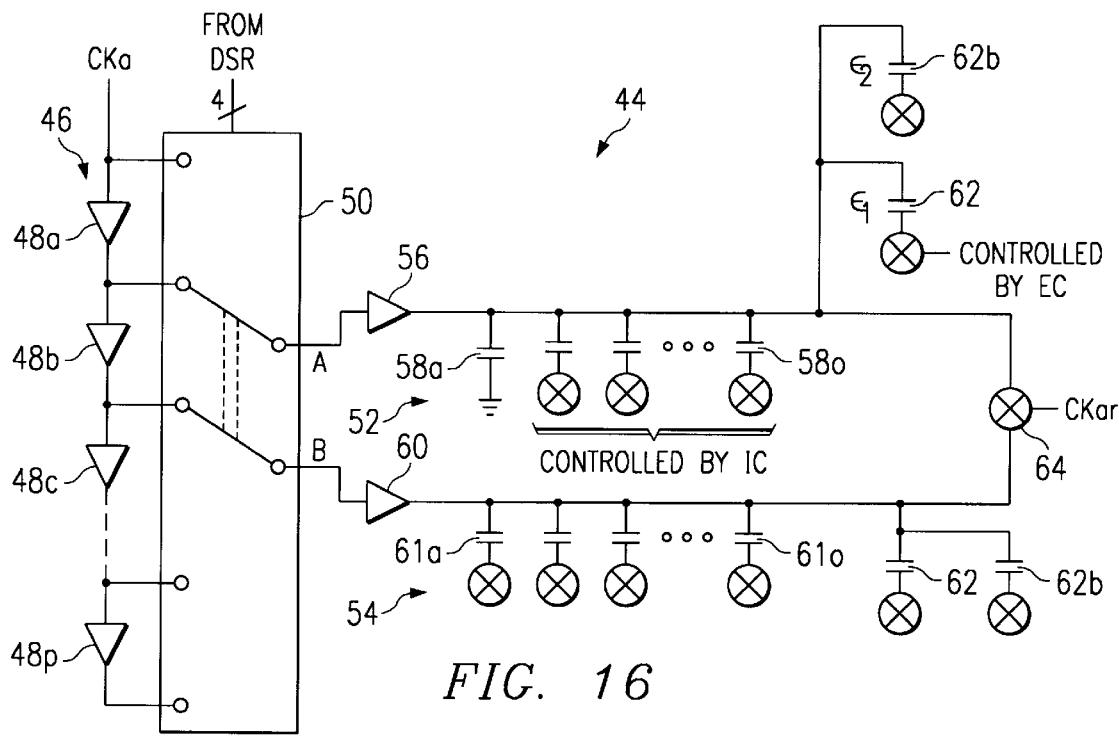
FIG. 16 illustrates a block diagram of a variable delay circuit for implementing the free running mode of the DPLL.

FIGS. 15–17 illustrate a free running embodiment of the DPLL described above. Unlike an analog PLL, which has an internal VCO (voltage controlled oscillator), the DPLL described above does not have an internal, free-running, frequency source. Instead, the DPLL has a gated multivibrator where m output clocks are generated for each input clock, CKref (where the input clock period is defined by the signal at the phase detector after any divide by n occurs). CKref initiates m output clocks whether or not the DPLL is in lock, provided the DPLL is able to operate at the specified output frequency. "Lock," in this instance, is defined by the uniformity of the multivibrator periods rather than frequency lock as in an analog PLL. If the multivibrator is incapable of operating at the specified frequency, if it is beyond the DPLL operating range, or if the input frequency is increasing at a rate faster than the DPLL can track, then the multivibrator bursts will be absent on alternate clock periods (previously defined as the stutter mode). This is always recognized as an "out of lock" condition necessitated by the requirement that narrow glitches should not be allowed to propagate down the delay element in the multivibrator. Without this "stuttering" feature, any new cycle starting immediately after a high-to-low transition edge which entered into the delay element would result in an high-to-low-to-high glitch.

Frequency modulation which can be tracked by the DPLL up to specification limits is a function of the square of the input clock frequency. The multivibrator period can be modified by 10 psec every reference clock cycle. The modulation which can be tracked can be calculated as follows:

$$\text{Frequency of tracked modulation } (F_{mod t}) < (10^{-11})(CK\text{ref})^2$$

Thus, for example, if CKref is at 10 MHz, the maximum $F_{mod t}$ is 1 KHz, which renders the DPLL narrow band. This is sufficient for the DPLL to track gradual changes due to battery voltage or temperature variations. Higher frequency noise components modulate the timing in the delay element on a per cycle basis, and any generated error over the period of the reference clock shows up in the last pulse generated by the multivibrator prior to the start of the next cycle. This significantly increases the cycle-to-cycle jitter of the DPLL and, if large enough, can cause the DPLL to leave lock and possibly enter the stutter mode described above.

In the preferred embodiment, implementation of the DPLL using a single multivibrator circuit operating in two distinctly different modes solves the problem of accumulated jitter in the last period of a clock cycle. The first mode is the out-of-lock mode wherein the multivibrator operates as described above (and shown in FIG. 14) until lock is achieved. Once lock is acquired, and the delay period is set properly, the DPLL switches the multivibrator into a continuous running mode. Before lock, each low-to-high transition of CKref triggers m multivibrator pulses, and the multivibrator stops after the m pulses to wait for the next low-to-high transition of CKref. Once lock is acquired, however, CKref no longer initiates a burst from the multivibrator, and the multivibrator does not stop to wait for a CKref transition, so jitter does not accumulated in the last period.

In order to run continuously, the phase of the output clock must be adjustable to allow a reference edge of the multivibrator to track low-to-high transition of CKref. While the period of the output is essentially 1/m that of CKref, slight inaccuracies will cause the reference edge of the multivibrator to drift relative to the incoming clock with the phase error being cumulative over time. When drift due to noise is factored in, the effect of cumulative drift is magnified. The reference edge of the multivibrator must be maintained in correct relationship with CKref for the DPLL to track low frequency FM. The continuous running mode accomplishes this tracking by adjusting the phase between the output clock and CKref depending upon the degree of phase error. Three windows of phase error are used in the preferred embodiment: (1) close in, (2) ±½ multivibrator period and (3) ±½ CKref clock period. The lock indicator is driven according to which category the current phase error falls into. The three windows of phase shift are shown in FIG. 15.

The close in window of phase error is defined by the circuits used to detect the lock condition when the DPLL is in the out-of-lock mode. This is a range where the two edges (CKr and CKref) are within approximately 500 psecs (or another predetermined time period) of each other. When the phase error is in the close in window, no special phase adjustment is needed.

When the multivibrator drifts into the ±½ multivibrator period window, an initial phase adjustment circuit is activated to move the reference edge of the multivibrator back toward the close-in-window. This phase adjustment circuit either adds or subtracts one $\epsilon$ of delay to each multivibrator clock period during ½ of the CKref clock period. Accordingly, there is more phase adjustment when the incoming clock frequency is low, either because m is high or because the autodivider ratio is high or a combination of the two. If, for example, m=10, phase would be shifted by $5\epsilon$ on the next cycle of CKref. If the autodivider also had a value of 2, then the phase shift would be $10\epsilon$ on the next CKref cycle. While this adjustment is greater than the normal phase control circuit which can adjust by one $\epsilon$ every four CKref cycles, it should be noted that the cycle to cycle variation of the output pulse (jitter) is typically only $\epsilon$. Jitter in this scheme is $\epsilon$*(autodivider ratio), so absolute value increases accordingly at higher autodivide ratios, but jitter as a percentage of the output period remains constant over large ranges in output period.

When the phase error exceeds ±½ of the multivibrator clock period, an additional phase adjustment is used. In this mode, $\epsilon$ is added or subtracted for each multivibrator clock period during the entire incoming clock period, thereby doubling the phase shift of the adjustment circuit for phase shifts within ½ of the multivibrator clock period. This level of adjustment is maintained until the phase error has been corrected or the phase error exceeds ½ the input clock period, at which point the DPLL drops out of lock. Again, overall cycle to cycle jitter is not adversely affected because movement is limited to one $\epsilon$.

If the multivibrator drops out of lock, the normal mechanisms for achieving lock, as shown in FIG. 14 are re-invoked.

When the DPLL is operating in the continuous run mode it can tolerate noise due to input or power supply variations within limits without breaking lock. When the average value of the noise is zero, the limits are a function of peak deviation (PD), modulating frequency ($F_{mod}$) and waveform. Square wave modulation is the worst case, and other modulating waveforms can be estimated by comparing their integrals to that of the square wave. If PD is described as a percentage of input frequency (e.g., 5 equals ±5% deviation), then the minimum square wave $F_{mod}$ can be calculated, knowing the DPLL stays in lock for a range of ±½ of the input clock period.

Frequency of square wave modulation $(Fmod1) > PD*(CKref/50$

The greater the modulating frequency, the larger the peak deviation allowed while remaining in lock. It should be noted that the DPLL output will not track these signals if they are above the $F_{mod_t}$ calculated above, but the DPLL will remain in lock. This feature allows the DPLL to clean up a "dirty" input clock or decode FSK inputs. $F_{mod}$ for other waveforms can be calculated as follows:

$$\text{Frequency of arbitrary modulation } (F_{mod2}) > \frac{F_{mod1}}{(PD)\pi} \int_0^\pi f(x)\,dx$$

where f(x) describes the arbitrary waveform expressed in the same terms as PD.

If the average value of noise is not zero, the low frequency component must not exceed $F_{mod_t}$ to guarantee the DPLL stays in lock.

The free running mode DPLL can be implemented with minor adjustments to the delay circuit shown in FIG. 16. This circuit is similar to the circuit of FIG. 5, with the addition of a capacitor 62b (for each delay path 52 and 54) which can be enabled independently of capacitors 58 and capacitor 62 to add a time delay of $\epsilon$. In the preferred embodiment, capacitor 62b is normally enabled during one phase CKr (for example the low logic phase) and disabled during other phase (the high logic level). When capacitor 62b is used to correct phase shift, it can be disabled during the normally enabled phase or enabled during the normally disabled phase.

In operation, the delay circuit, with the exception of capacitor 62b, the delay circuit of FIG. 16 operates the same as the delay circuit of FIG. 5 until lock is acquired. Once lock is acquired, however, CKref does not initiate multivibrator bursts (unless the DPLL comes out of lock). Instead, phase shifts between CKr and CKref are corrected depending upon the degree of phase shift. So long as the phase shift is within the close-in window, correction is completed using the normal mechanisms.

Once the phase shift moves outside the close-in window, correction is made using capacitor 62b. Timing diagrams showing the correction are illustrated in FIGS. 17a–f. FIG.

Figure 17A:
FIGS. 17a through 17f illustrate timing diagrams describing the phase shift correction mechanisms used in the free running mode.
Figure 17B:
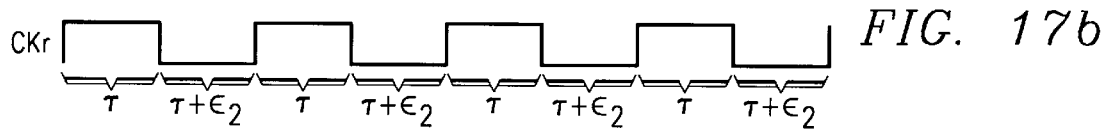
Figure 17C:
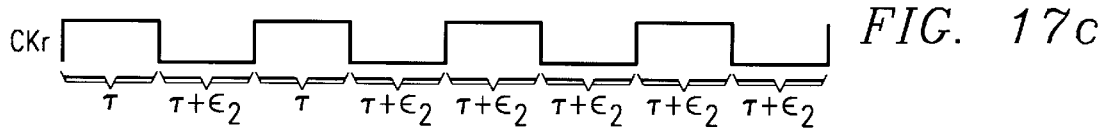
Figure 17D:
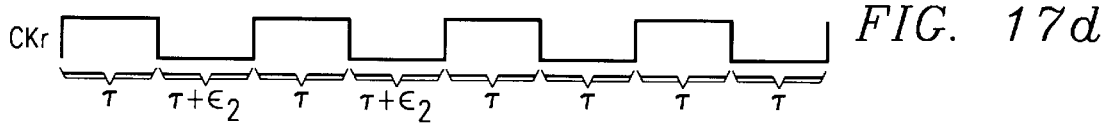
Figure 17E:
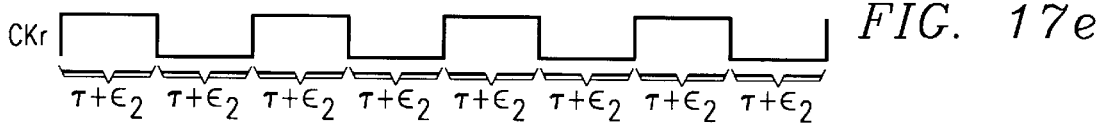

17a illustrates a CKref signal and FIG. 17b illustrates CKr for m=4. In normal mode (while the phase shift is in the close-in window), capacitor 62b is enabled for the low logic phases and disabled for the high logic phases, as shown in FIG. 17b. Thus, the high logic phases are shown having a duration of τ and the low logic phases are shown having a duration of τ+ε2. If there is too little delay in the multivibrator, causing the phase shift to exceed the boundaries of the close-in window (but not out of the ±½ multivibrator period), capacitor 62b is enabled for one half cycle on the high logic phases, as shown in FIG. 17c. The capacitor will be enabled for these cycles until the phase shift returns to the close-in window. Similarly, if there is too much delay in the multivibrator, causing the phase shift to exceed the boundaries of the close-in window (but not out of the ±½ multivibrator period), capacitor 62b is disabled for one half cycle on the low logic phases, as shown in FIG. 17d. The capacitor will remain disabled for these cycles until the phase shift returns to the close-in window.

Figure 17F:
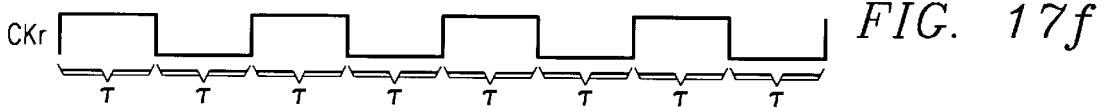

If the phase shift exceeds the ±½ multivibrator period, but remains in lock, the amount of phase shift provided by capacitor 62b is doubled by enabling or disabling the capacitor for all clock cycles. Thus in FIG. 17e, where there is insufficient delay, capacitor 62b is enabled on every clock cycle, until the phase shift returns to the ±½ multivibrator period window. In FIG. 17f, where there is too much delay, capacitor 62b is disabled for every clock cycle, until the phase shift returns to the ½ multivibrator period window.

The present invention provides significant advantages over the prior art. First, by using a single delay circuit to generate both phases of the output clock, the power requirements are vastly reduced. Second, the commutator provides an accurate and consistent steps of delay. Third, the incorporation of the autodivider in the DPLL provides a very wide operating range. Fourth, the stutter mode circuitry prevents transient glitches from propagating through the multivibrator circuitry. Fifth, the free running mode allows for phase shift corrections for wide phase shifts without causing significant jitter.

Although the Detailed Description of the invention has been directed to certain exemplary embodiments, various modifications of these embodiments, as well as alternative embodiments, will be suggested to those skilled in the art. The invention encompasses any modifications or alternative embodiments that fall within the scope of the Claims.

What is claimed is:

1. A digital circuit comprising:
 a plurality of inputs for receiving logic signals;
 circuitry, coupled to said inputs, for passing one of said signals responsive to the order in which a transition is received on each of said inputs.

2. The digital circuit of claim 1 wherein said passing circuitry comprises circuitry for passing a signal which has a first transition.

3. The digital circuit of claim 1 wherein said passing circuitry comprises circuitry for passing a signal which has a last transition.

4. The digital circuit of claim 1 wherein said inputs are coupled to delay paths.

5. The digital circuit of claim 1 wherein passing circuitry comprises a first circuit for passing said one of said signals responsive to a signal at one of said inputs transitioning from a low state to a high state and a second circuit for passing said one of said signals responsive to a signal at one of said circuits transitioning from a high state to a low state.

6. The digital circuit of claim 5 wherein said passing circuitry further comprises multiplexer circuitry coupled to outputs of said first and second circuits.

7. The digital circuit of claim 5 wherein said first circuit performs a logical NAND operation on the outputs of said first and second delay circuits.

8. The digital circuit of claim 7 wherein said second circuit performs a logical NOR operation on the outputs of said first and second delay circuits.

9. The digital circuit of claim 1 wherein said inputs are coupled to two delay paths.

10. The digital circuit of claim 5, wherein said first and second circuits are delay circuits.

11. A digital circuit comprising:
 a plurality of inputs for receiving logic signals;
 first and second delay circuits, coupled to said inputs, for passing one of said signals responsive to the order in which a transition is received on each of said inputs.

* * * * *